(12) United States Patent
Hu et al.

(10) Patent No.: US 11,699,061 B2
(45) Date of Patent: Jul. 11, 2023

(54) STORAGE APPARATUS AND ELECTRONIC DEVICE

(71) Applicant: Huawei Technologies Co., Ltd., Shenzhen (CN)

(72) Inventors: Honghui Hu, Shenzhen (CN); Guangqing Liang, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 17/413,209

(22) PCT Filed: Jul. 17, 2019

(86) PCT No.: PCT/CN2019/096430
§ 371 (c)(1),
(2) Date: Jun. 11, 2021

(87) PCT Pub. No.: WO2020/119123
PCT Pub. Date: Jun. 18, 2020

(65) Prior Publication Data
US 2022/0067477 A1    Mar. 3, 2022

(30) Foreign Application Priority Data

Dec. 14, 2018  (CN) .......................... 201811536116.1

(51) Int. Cl.
*G06F 1/26* (2006.01)
*G06F 1/3234* (2019.01)
*G06K 19/077* (2006.01)

(52) U.S. Cl.
CPC ....... *G06K 19/07766* (2013.01); *G06F 1/266* (2013.01); *G06F 1/3275* (2013.01)

(58) Field of Classification Search
CPC combination set(s) only.
See application file for complete search history.

(56) References Cited

U.S. PATENT DOCUMENTS

| 5,777,934 A | 7/1998 | Lee et al. |
| 2002/0063351 A1 | 5/2002 | Hanabe et al. |
| 2002/0114184 A1 | 8/2002 | Gongwer et al. |

(Continued)

FOREIGN PATENT DOCUMENTS

| CN | 1713112 A | 12/2005 |
| CN | 2886681 Y | 4/2007 |

(Continued)

*Primary Examiner* — Kim Huynh
*Assistant Examiner* — Cory A. Latham
(74) *Attorney, Agent, or Firm* — Conley Rose, P.C.

(57) ABSTRACT

A storage apparatus includes a control chip, a storage chip, a power interface configured to receive a first voltage, a first variable-voltage circuit. An input end of the first variable-voltage circuit is coupled to the power interface. The first variable-voltage circuit is configured to convert the first voltage into a second voltage, and provide the second voltage to the control chip and a second variable-voltage circuit, where an input end of the second variable-voltage circuit is coupled to the power interface. The second variable-voltage circuit is configured to convert the first voltage into a third voltage and provide the third voltage to the control chip and the storage chip.

14 Claims, 3 Drawing Sheets

(56) References Cited

U.S. PATENT DOCUMENTS

| | | | |
|---|---|---|---|
| 2003/0202400 A1* | 10/2003 | Pekny | H03K 17/693 365/200 |
| 2004/0243877 A1 | 12/2004 | Sakamoto et al. | |
| 2006/0056216 A1 | 3/2006 | Rhelimi | |
| 2006/0250832 A1 | 11/2006 | Su et al. | |
| 2007/0008801 A1 | 1/2007 | Chiang et al. | |
| 2007/0147157 A1 | 6/2007 | Luo et al. | |
| 2008/0080254 A1 | 4/2008 | Kagan et al. | |
| 2009/0125673 A1* | 5/2009 | Ito | G06F 13/4234 711/E12.001 |
| 2009/0298541 A1* | 12/2009 | Roh | G06K 7/04 455/558 |
| 2010/0213262 A1 | 8/2010 | Hoeksel et al. | |
| 2011/0055595 A1 | 3/2011 | Slaton | |
| 2011/0289268 A1* | 11/2011 | Patel | G06F 3/0683 711/E12.078 |
| 2013/0124888 A1 | 5/2013 | Tanaka et al. | |
| 2015/0279439 A1 | 10/2015 | Pyo et al. | |
| 2016/0054953 A1 | 2/2016 | Lee et al. | |
| 2016/0352223 A1* | 12/2016 | Choo | G11C 7/04 |
| 2017/0308724 A1 | 10/2017 | Kothamasu et al. | |

FOREIGN PATENT DOCUMENTS

| | | |
|---|---|---|
| CN | 101271725 A | 9/2008 |
| CN | 104952478 A | 9/2015 |
| CN | 105205514 A | 12/2015 |
| JP | S5316540 A | 2/1978 |
| JP | H0935476 A | 2/1997 |
| JP | 2004531801 A | 10/2004 |
| JP | 2004355163 A | 12/2004 |
| JP | 2009035476 A | 2/2009 |
| JP | 2011081779 A | 4/2011 |
| JP | 2014232540 A | 12/2014 |
| KR | 2007038798 A * | 4/2007 |

* cited by examiner

STORAGE APPARATUS AND ELECTRONIC DEVICE

CROSS-REFERENCE TO RELATED APPLICATIONS

This application is a U.S. National Stage of International Patent Application No. PCT/CN2019/096430 filed on Jul. 17, 2019, which claims priority to Chinese Patent Application No. 201811536116.1 filed on Dec. 14, 2018. Both of the aforementioned applications are hereby incorporated by reference in their entireties.

TECHNICAL FIELD

This application relates to the field of storage technologies, and in particular, to a storage apparatus and an electronic device.

BACKGROUND

A storage card is an independent storage medium used in a mobile phone, a digital camera, a portable computer, an MP3, and another digital product, and is generally in a card form. Therefore, the storage card is collectively referred to as a "storage card", and is also referred to as a "digital storage card", a "digital storage card", a "storage card", or the like.

Storage cards generally include an SD series, an MMC series, and a PCIe series. Some of the storage cards need to be driven by two externally provided power supplies (with different voltages) to work, and a dedicated card slot needs to be provided to cooperate with the storage card. It is relatively difficult for the dedicated card slot to be compatible with another storage card slot.

SUMMARY

To resolve the foregoing problem, this application provides a storage apparatus and an electronic device. The storage apparatus can work as long as one power supply is externally provided, thereby improving compatibility.

A technical solution used in this application is as follows: A storage apparatus is provided. The storage apparatus includes: a control chip; a storage chip; a power interface, configured to receive an external first voltage; a first variable-voltage circuit, where an input end of the first variable-voltage circuit is coupled to the power interface, an output end of the first variable-voltage circuit is coupled to the control chip, and the first variable-voltage circuit is configured to convert the first voltage into a second voltage, and provide the second voltage to the control chip; and a second variable-voltage circuit, where an input end of the second variable-voltage circuit is coupled to the power interface, an output end of the second variable-voltage circuit is coupled to the control chip and the storage chip, and the second variable-voltage circuit is configured to convert the first voltage into a third voltage, and provide the third voltage to the control chip and the storage chip.

The first voltage is 3.3 V, and the second voltage is 1.2 V.

The control chip includes a first power-supply pin, and is coupled to the output end of the first variable-voltage circuit, to provide the second voltage to a core module of the control chip.

The first voltage is 3.3 V, and the third voltage is 1.8 V.

The storage apparatus is a storage apparatus based on an EMMC protocol. The control chip includes: an EMMC IO pin, coupled to the output end of the second variable-voltage circuit; and a first flash IO pin, separately coupled to the output end of the second variable-voltage circuit and the power interface by using a switch, to choose, based on a requirement, to input the first voltage or the third voltage. The storage chip includes: a second flash IO pin, separately coupled to the output end of the second variable-voltage circuit and the power interface by using the switch, to choose, based on a requirement, to input the first voltage or the third voltage.

A first input end of the switch is coupled to the output end of the second variable-voltage circuit, a second input end of the switch is coupled to the power interface, and an output end of the switch is coupled to the first flash IO pin and the second flash IO pin.

The first voltage is 3.3 V. The storage chip further includes a second power-supply pin, where the second power-supply pin is coupled to the power interface, to provide the first voltage to a core module of the storage chip.

The first variable-voltage circuit and/or the second variable-voltage circuit are integrated into the control chip.

The storage apparatus further includes: a substrate, including a first side surface and a second side surface that are opposite to each other, where the storage chip is disposed on the first side surface, and the control chip is disposed on a side, away from the substrate, of the storage chip; and a plurality of contacts, disposed on the second side surface, where the power interface is one of the plurality of contacts.

Another technical solution used in this application is as follows: An electronic device is provided. The electronic device includes: a power supply; a processor, coupled to the power supply; and a storage apparatus, coupled to the processor, where the storage apparatus is the foregoing storage apparatus.

The storage apparatus provided in this application includes: a control chip; a storage chip; a power interface, configured to receive an external first voltage; a first variable-voltage circuit, where an input end of the first variable-voltage circuit is coupled to the power interface, an output end of the first variable-voltage circuit is coupled to the control chip, and the first variable-voltage circuit is configured to convert the first voltage into a second voltage, and provide the second voltage to the control chip; and a second variable-voltage circuit, where an input end of the second variable-voltage circuit is coupled to the power interface, an output end of the second variable-voltage circuit is coupled to the control chip and the storage chip, and the second variable-voltage circuit is configured to convert the first voltage into a third voltage, and provide the third voltage to the control chip and the storage chip. In the foregoing manner, when only one voltage is externally provided, three different voltages can be provided to the control chip and the storage chip by using the two variable-voltage circuits, so that the storage apparatus can be further applied to more scenarios, thereby improving compatibility.

BRIEF DESCRIPTION OF DRAWINGS

To describe the technical solutions in the embodiments of this application more clearly, the following briefly describes the accompanying drawings for describing the embodiments. It is clear that the accompanying drawings in the following description show merely some embodiments of this application, and a person of ordinary skill in the art may still derive other drawings from these accompanying drawings without creative efforts.

DESCRIPTION OF EMBODIMENTS

Mentioning an "embodiment" in the specification means that a particular characteristic, structure, or feature described with reference to the embodiment may be included in at least one embodiment of this application. The phrase shown in various locations in the specification may not necessarily refer to a same embodiment, and is not an independent or optional embodiment exclusive from another embodiment. It is explicitly and implicitly understood by a person skilled in the art that the embodiments described in the specification may be combined with another embodiment.

Figure 1:
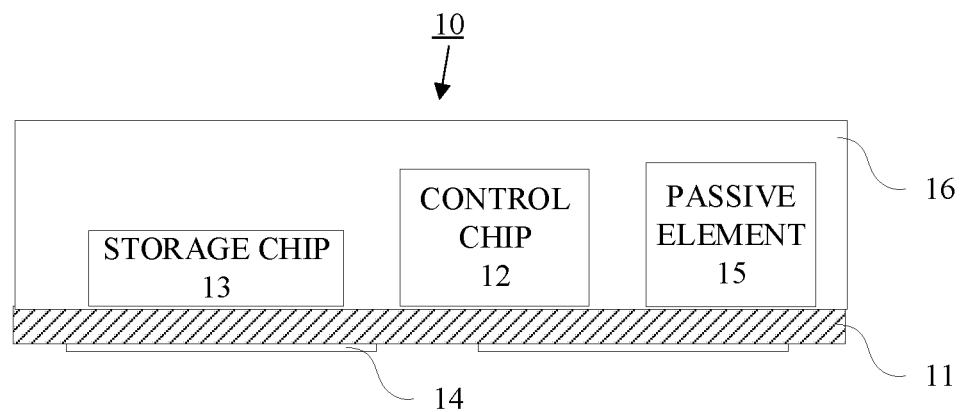
FIG. 1 is a schematic structural diagram of a first embodiment of a storage apparatus according to this application.

FIG. 1 is a schematic structural diagram of a first embodiment of a storage apparatus according to this application. The storage apparatus 10 includes a substrate 11, and a control chip 12, a storage chip 13, and an interface contact 14 that are disposed on the substrate 11.

Optionally, a passive element 15 may be further disposed on the substrate 11. The passive element 15 may include commonly used circuit components such as a resistor, a capacitor, and an inductor.

In this embodiment, the control chip 12, the storage chip 13, and the passive element 15 are covered with a packaging layer 16. In this embodiment, the control chip 12 and the storage chip 13 are unpackaged dies (die). Generally, the storage chip 13 is a NAND flash chip, a quantity of storage chips may be set based on an actual requirement, and the storage chips are stacked on a surface of the substrate 11. For example, a storage capacity of one flash is 64 GB. If two flashes are stacked, a storage capacity of the entire storage apparatus 10 is 128 GB. If four flashes are stacked, a storage capacity of the entire storage apparatus 10 is 256 GB.

In addition, in another embodiment, the control chip 12 and the storage clip 13 may also be packaged chips.

In an optional embodiment, the control chip 12, the storage chip 13, and the passive element 15 are disposed on a side surface of the substrate 11, and the interface contact 14 is disposed on the other opposite side surface of the substrate 11.

In addition, in another embodiment, in consideration of a relatively large area of the storage chip 13, the control chip 12 may also be disposed on the storage chip 13 for stacking.

Figure 2:
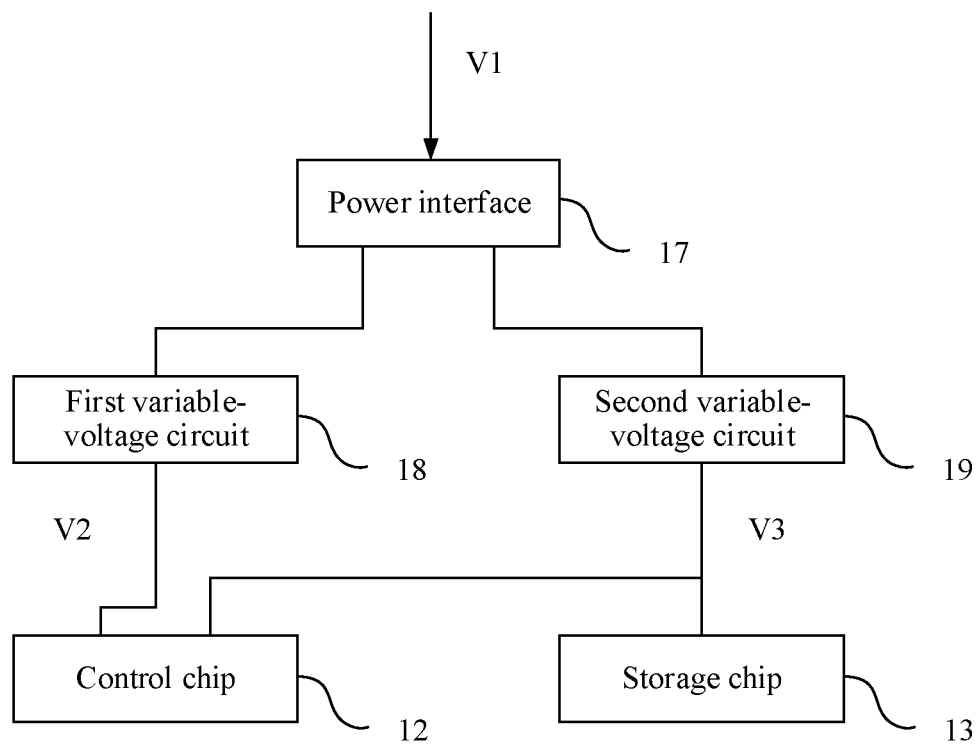
FIG. 2 is a schematic diagram of a circuit structure of a first embodiment of a storage apparatus according to this application.

FIG. 2 is a schematic diagram of a circuit structure of a first embodiment of a storage apparatus according to this application. The storage apparatus 10 further includes a power interface 17, a first variable-voltage circuit 18, and a second variable-voltage circuit 19.

The power interface 17 is configured to receive an external first voltage V1. An input end of the first variable-voltage circuit 18 is coupled to the power interface 17. An output end of the first variable-voltage circuit 18 is coupled to the control chip 12. The first variable-voltage circuit 18 is configured to convert the first voltage V1 into a second voltage V2, and provide the second voltage to the control chip 12. An input end of the second variable-voltage circuit 19 is coupled to the power interface 17. An output end of the second variable-voltage circuit 19 is coupled to the control chip 12 and the storage chip 13. The second variable-voltage circuit 19 is configured to convert the first voltage V1 into a third voltage V3, and provide the third voltage V3 to the control chip 12 and the storage chip 13.

The first voltage V1 may be separately converted into the second voltage V2 and the third voltage V3 by using the two variable-voltage circuits in the foregoing manner. In addition to the first voltage V1, three different voltages that are the first voltage V1, the second voltage V2, and the third voltage V3 may be provided to the control chip 12 and the storage chip 13, to drive the two chips to work.

In the foregoing embodiment, the first variable-voltage circuit 18 and the second variable-voltage circuit 19 may be disposed on the substrate 11, or inside the control chip 12.

The storage apparatus provided in this application includes: the control chip; the storage chip; the power interface, configured to receive the external first voltage; the first variable-voltage circuit, where the input end of the first variable-voltage circuit is coupled to the power interface, the output end of the first variable-voltage circuit is coupled to the control chip, and the first variable-voltage circuit is configured to convert the first voltage into the second voltage, and provide the second voltage to the control chip; the second variable-voltage circuit, where the input end of the second variable-voltage circuit is coupled to the power interface, the output end of the second variable-voltage circuit is coupled to the control chip and the storage chip, and the second variable-voltage circuit is configured to convert the first voltage into the third voltage, and provide the third voltage to the control chip and the storage chip. In the foregoing manner, when only one voltage is externally provided, three different voltages can be provided to the control chip and the storage chip by using the two variable-voltage circuits, so that the storage apparatus can be further applied to more scenarios, thereby improving compatibility.

An example of a storage apparatus using an EMMC (Embedded Multimedia Card) protocol such as an NM card (multimedia storage card) is used below for description.

The NM card includes eight sub-contacts, and the eight sub-contacts are respectively represented by numbers 1 to 8. The eight sub-contacts are arranged in 4 rows and 2 columns with a long side of the NM card as a row and a short side as a column. The interface contact includes a first sub-contact, a second sub-contact, a third sub-contact, and a fourth sub-contact arranged in turn in a first column m a sequential order, and a fifth sub-contact, a sixth sub-contact, a seventh sub-contact, an eighth sub-contact arranged in turn in a second column in a reverse order.

It may be understood that sub-contacts are insulated from each other.

In this embodiment, the interface contact 14 is configured to establish an electrical connection between the storage apparatus 10 and an external device. The external interface uses an eMMC protocol. In this embodiment, the interface contact 14 includes a 3.3 V power contact (VCC), a ground contact (GND), a clock contact (CLK), a command contact (CMD), and four data contacts (D0 to D3). In this embodiment, the eight interface contacts are set as follows:

| Sub-contact number | Definition |
| --- | --- |
| 1 | D1 |
| 2 | CMD |
| 3 | GND |
| 4 | D3 |
| 5 | D2 |
| 6 | VCC |
| 7 | D0 |
| 8 | CLK |

The VCC pin is configured to receive the externally provided first voltage, and is equivalent to the power interface in the foregoing embodiment.

The standard eMMC protocol needs to provide two power inputs: VCC (3.3 V) and VCCQ (3.3 V or 1.8 V), and eight data pins. To reduce an area of a storage card, eight interface contacts are disposed on the NM card provided in this embodiment. Among the eight interface contacts, only the VCC pin exists. Therefore, only the 3.3 V power input is reserved, and only four data interface contacts are disposed. The storage apparatus in this embodiment supports the following rate modes:

| Mode | Data rate | Bus width | Frequency | Max data transfer (x8) |
| --- | --- | --- | --- | --- |
| Backward compatible | Single | x1, x4, x8 | 0 to 26 MHz | 26 MB/s |
| High speed SDK | Single | x1, x4, x8 | 0 to 52 MHz | 52 MB/s |
| High speed DDR | Dual | x4, x8 | 0 to 52 MHz | 104 MB/s |
| HS200 | Single | x4, x8 | 0 to 200 MHz | 200 MB/s |
| HS400 | Dual | x8 | 0 to 200 MHz | 400 MB/s |

Figure 3:
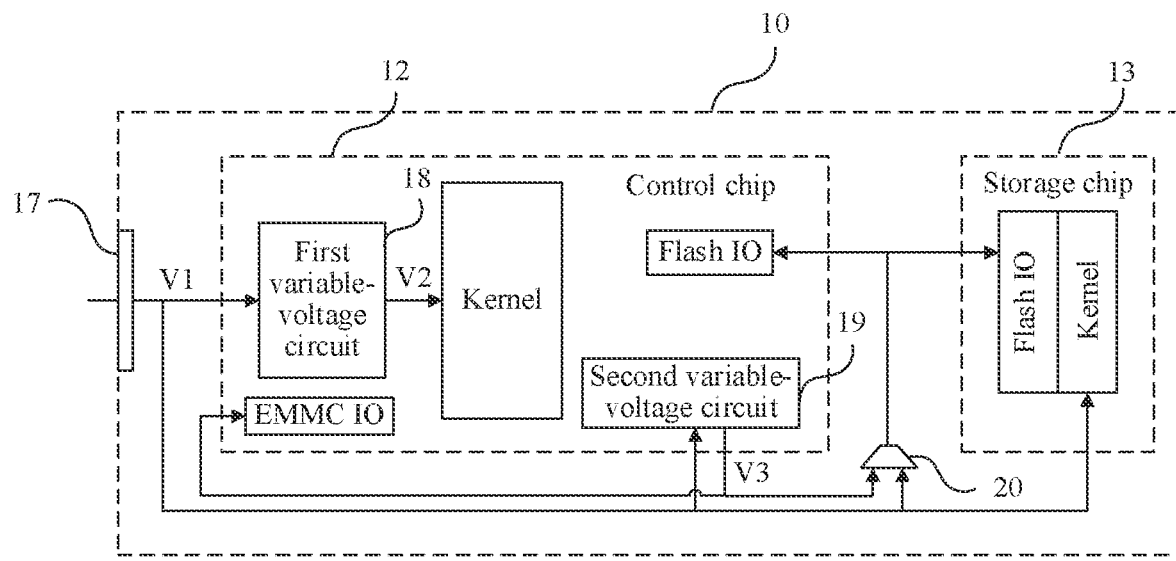
FIG. 3 is a schematic diagram of a circuit structure of a second embodiment of a storage apparatus according to this application.

FIG. 3 is a schematic diagram of a circuit structure of a second embodiment of a storage apparatus according to this application.

In this embodiment, the storage apparatus 10 includes a control chip 12, a storage chip 13, a power interface 17, a first variable-voltage circuit 18, a second variable-voltage circuit 19, and a switch circuit 20.

The power interface 17 is configured to receive an external first voltage V1. An input end of the first variable-voltage circuit 18 is coupled to the power interface 17. An output end of the first variable-voltage circuit 18 is coupled to the control chip 12. The first variable-voltage circuit 18 is configured to convert the first voltage V1 into a second voltage V2, and provide the second voltage to the control chip 12. An input end of the second variable-voltage circuit 19 is coupled to the power interface 17. An output end of the second variable-voltage circuit 19 is coupled to the control chip 12 and the storage chip 13. The second variable-voltage circuit 19 is configured to convert the first voltage V1 into a third voltage V3, and provide the third voltage V3 to the control chip 12 and the storage chip 13.

Further, in this embodiment, the first voltage is 3.3 V, the second voltage is 1.2 V, and the third voltage is 1.8 V.

It may be understood that an operating voltage of a core module of the control chip 12 is 1.2 V. Specifically, the control chip 12 includes a first power-supply pin (not shown in the figure). The first power-supply pin is coupled to the output end of the first variable-voltage circuit 18, to provide the second voltage V2 to the core module of the control chip 12.

In addition, the control chip 12 further includes an EMMC IO pin (not marked) and a first flash IO pin (not marked). The storage chip 13 includes a second flash IO pin (not marked). The first flash IO pin is coupled to the second flash IO pin, and is configured to enable an instruction or data to be transmitted between the control chip 12 and the storage chip 13.

It may be understood that an operating voltage of the EMMC IO pin is 1.8 V, and an operating voltage of the first flash IO pin and an operating voltage of the second flash IO pin are 1.8 V or 3.3 V.

Specifically, the EMMC IO pin is coupled to the output end of the second variable-voltage circuit 19. The first flash IO pin is separately coupled to the output end of the second variable-voltage circuit 19 and the power interface 17 by using the switch circuit 20, to choose, based on a requirement, to input the first voltage V1 or the third voltage V3. The second flash IO pin is separately coupled to the output end of the second variable-voltage circuit 19 and the power interface 17 by using the switch 20, to choose, based on a requirement, to input the first voltage V1 or the third voltage V3. A first input end of the switch 20 is coupled to the output end of the second variable-voltage circuit 19, a second input end of the switch is coupled to the power interface 17, and an output end of the switch is coupled to the first flash IO pin and the second flash IO pin.

It may be understood that an operating voltage of a core module of the storage chip 13 is 3.3 V. In the foregoing embodiment, the storage chip 13 further includes a second power-supply pin (not shown in the figure). The second power-supply pin is coupled to the power interface 17, to provide the first voltage V1 to the core module of the storage chip 13.

Because the storage apparatus 10 provided in this embodiment is provided with only a 3.3 V power interface, and supports only a 3.3 V power input, the first variable-voltage circuit 18 and the second variable-voltage circuit 19 are added to convert the input 3.3 V power supply into a 1.8 V power output and a 1.2 V power output, and provide a 1.8 V power input and a 1.2 V power input for the control chip 12 and/or the storage chip 13.

It may be understood that, in this embodiment, both the first variable-voltage circuit 18 and the second variable-voltage circuit 19 may be integrated inside the control chip 12.

Figure 4:
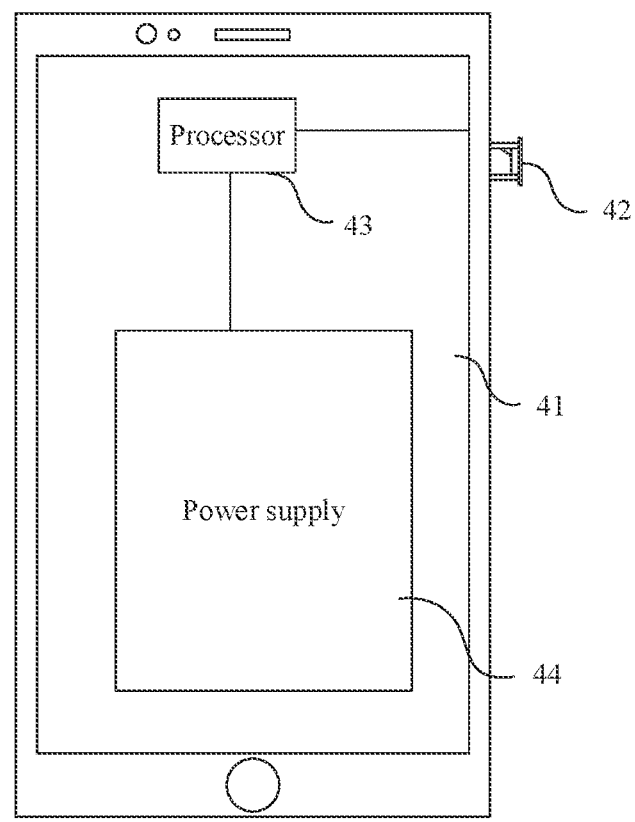
FIG. 4 is a schematic structural diagram of an embodiment of an electronic device according to this application.

FIG. 4 is a schematic structural diagram of an embodiment of an electronic device according to this application. The electronic device includes a device body 41 and a card tray 42 that can be built in the device body 41. In addition, the electronic device further includes a processor 43 and a power supply 44. The processor 43 is separately coupled to the power supply 44 and a card slot. A storage card in the card tray may be further coupled to the processor 43 through the card slot.

Figure 5:
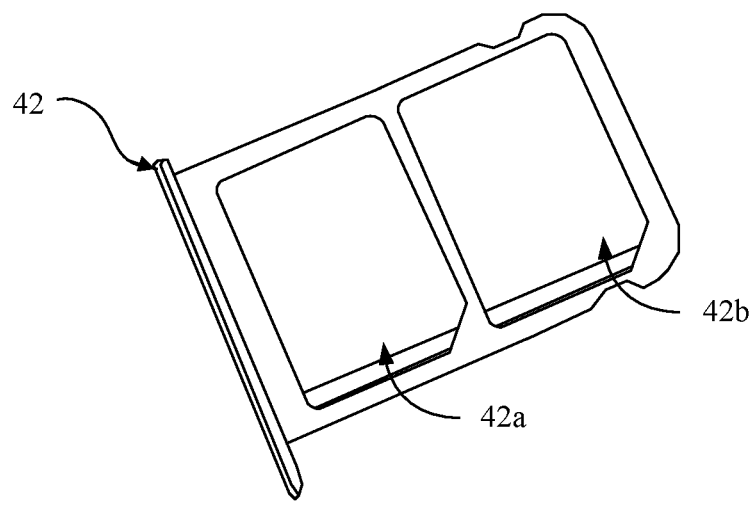
FIG. 5 is a schematic structural diagram of a card tray in an embodiment of an electronic device according to this application.

FIG. 5 is a schematic structural diagram of a card tray in an embodiment of an electronic device according to this application. The card tray 42 includes a SIM card slot 42a and a storage card slot 42b. The SIM card slot 42a has a same shape as the storage card slot 42b. The storage card slot 42b is used for accommodating the storage apparatus provided in the foregoing embodiment.

The foregoing descriptions are merely implementations of this application, and are not intended to limit the scope of this application. An equivalent structural or equivalent process alternation made by using the content of the specification and drawings of this application, or an application of the content of the specification and drawings directly or indirectly to another related technical field, shall fall within the protection scope of this application.

What is claimed is:

1. A storage apparatus comprising:
a control chip comprising:
a first core circuit;
an embedded MultiMediaCard input/output (EMMC I/O) circuit; and
a first flash I/O circuit;
a storage chip comprising:
a second flash I/O circuit; and
a second core circuit;
a power interface coupled to the control chip and to the storage chip and configured to receive a first voltage of 3.3V;
a first variable-voltage circuit coupled to the power interface and comprising a first input end, wherein the first variable-voltage circuit is configured to:
receive the first voltage at the first input end;
convert the first voltage to a second voltage of 1.2V; and
provide the second voltage to the first core circuit; and
a second variable-voltage circuit coupled to the power interface and comprising a second input end, wherein the second variable-voltage circuit is configured to:
receive the first voltage at the second input end;
convert the first voltage into a third voltage of 1.8V; and
provide the third voltage to the EMMC I/O circuit; and
a switch circuit coupled to an output of the second variable-voltage circuit, the power interface, and to the first flash I/O circuit and the second flash I/O circuit,
wherein the first flash I/O circuit and the second flash I/O circuit are configured to receive the first voltage or the third voltage, and
wherein the second core circuit is configured to receive the first voltage.

2. The storage apparatus of claim 1, wherein the first flash I/O circuit is coupled to the second flash I/O circuit.

3. The storage apparatus of claim 2, wherein the first flash I/O circuit is configured to communicate instructions or data to the second flash I/O circuit.

4. An electronic device comprising:
a first card slot operable at a first voltage;
a second card slot operable at a second voltage; and
a storage apparatus accommodated in the first card slot and comprising:
a control chip comprising:
a first core circuit;
an embedded MultiMediaCard input/output (EMMC I/O) circuit; and
a first flash I/O circuit;
a storage chip comprising:
a second flash I/O circuit; and
a second core circuit;
a power interface coupled to the control chip and to the storage chip and configured to receive the first voltage;
a first variable-voltage circuit coupled to the power interface and comprising a first input end and configured to:
receive the first voltage at the first input end;
convert the first voltage into the second voltage; and
provide the second voltage to the first core circuit; and
a second variable-voltage circuit coupled to the power interface and comprising a second input end and configured to:
receive the first voltage at the second input end;
convert the first voltage to a third voltage; and
provide the third voltage to the EMMC I/O circuit; and
a switch circuit coupled to an output of the second variable-voltage circuit, the power interface, and to the first flash I/O circuit and the second flash I/O circuit,
wherein the first flash I/O circuit and the second flash I/O circuit are configured to receive first power based on the first voltage or the third voltage, and
wherein the second core circuit is configured to receive second power based on the first voltage.

5. The electronic device of claim 4, wherein the first voltage is 3.3 volts (V), and wherein the third voltage is 1.8 V.

6. The storage apparatus of claim 1, wherein the storage apparatus is configured to implement an embedded MultiMediaCard (EMMC) protocol.

7. The storage apparatus of claim 1, further comprising a substrate, wherein the control chip and the storage chip are disposed on the substrate.

8. The storage apparatus of claim 1, further comprising a substrate, wherein the first variable-voltage circuit and the second variable-voltage circuit are disposed on the substrate.

9. The storage apparatus of claim 1, wherein the control chip and the storage chip are arranged in a stack.

10. The electronic device of claim 4, wherein the first voltage is 3.3 volts (V), and wherein the second voltage is 1.2 V.

11. The electronic device of claim 4, wherein the second card slot is configured to accommodate a subscriber identity module (SIM) card.

12. The electronic device of claim 4, further comprising a processor configured to couple to the storage apparatus through the first card slot.

13. The electronic device of claim 4, wherein the first card slot is configured to accommodate a multimedia storage card.

14. The electronic device of claim 4, wherein the control chip and the storage chip are arranged in a stack.

* * * * *